(12) United States Patent
Zhou et al.

(10) Patent No.: US 10,193,089 B2
(45) Date of Patent: Jan. 29, 2019

(54) DISPLAY DEVICE, ARRAY SUBSTRATE, AND MANUFACTURING METHOD

(71) Applicant: Shenzhen China Star Optoelectronics Technology Co., Ltd., Shenzhen, Guangdong (CN)

(72) Inventors: Zhichao Zhou, Guangdong (CN); Hui Xia, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 117 days.

(21) Appl. No.: 15/123,641

(22) PCT Filed: Jul. 6, 2016

(86) PCT No.: PCT/CN2016/088918
§ 371 (c)(1),
(2) Date: Sep. 4, 2016

(87) PCT Pub. No.: WO2017/201822
PCT Pub. Date: Nov. 30, 2017

(65) Prior Publication Data
US 2018/0090704 A1    Mar. 29, 2018

(30) Foreign Application Priority Data
May 27, 2016    (CN) .......................... 2016 1 0368409

(51) Int. Cl.
*H01L 27/12*    (2006.01)
*H01L 51/05*    (2006.01)
(Continued)

(52) U.S. Cl.
CPC ...... *H01L 51/0508* (2013.01); *H01L 27/1248* (2013.01); *H01L 27/1259* (2013.01);
(Continued)

(58) Field of Classification Search
None
See application file for complete search history.

(56) References Cited

U.S. PATENT DOCUMENTS 6,297,080 B1 * 10/2001 Lee ........................ G02F 1/1368
257/55
6,724,361 B1 * 4/2004 Washio ................ G09G 3/3677
345/100

(Continued)

FOREIGN PATENT DOCUMENTS

| CN | 103091921 A | 5/2013 |
| CN | 104218092 A | 12/2014 |
| CN | 104503164 A | 4/2015 |

*Primary Examiner* — Thao P Le
(74) *Attorney, Agent, or Firm* — Andrew C. Cheng

(57) ABSTRACT

A display device, an array substrate, and a manufacturing method for the array substrate are disclosed. The array substrate includes a substrate base, and two gates, a source, a drain, an active layer, and a pixel electrode on the substrate base. The drain and the pixel electrode are connected together. The source and the drain contact the active layer, respectively. The two gates control the conduction and cut off of the active layer, which in turn controls the conduction and cut off between the source and the drain. Through the present disclosure, the variation of threshold voltage is effectively prevented.

8 Claims, 4 Drawing Sheets

(51) Int. Cl.
  *H01L 27/32* (2006.01)
  *H01L 29/417* (2006.01)
  *H01L 29/423* (2006.01)
  *H01L 29/66* (2006.01)
  *H01L 29/786* (2006.01)

(52) U.S. Cl.
  CPC .... *H01L 27/3262* (2013.01); *H01L 29/41733* (2013.01); *H01L 29/42384* (2013.01); *H01L 29/66765* (2013.01); *H01L 29/78618* (2013.01)

(56) References Cited

U.S. PATENT DOCUMENTS

| | | | |
|---|---|---|---|
| 6,730,548 B1 * | 5/2004 | Yang | H01L 29/66757 257/344 |
| 2002/0037646 A1 | 3/2002 | Lyu | |
| 2002/0079501 A1 * | 6/2002 | Okada | G02F 1/1362 257/88 |
| 2005/0056847 A1 * | 3/2005 | Nakamura | H01L 27/016 257/72 |
| 2005/0206590 A1 * | 9/2005 | Sasaki | G09G 3/3233 345/76 |
| 2010/0265411 A1 * | 10/2010 | Yamashita | G02F 1/136213 348/731 |
| 2014/0077298 A1 | 3/2014 | Ma | |
| 2016/0260843 A1 | 9/2016 | Choi et al. | |
| 2017/0092658 A1 * | 3/2017 | Sun | H01L 27/124 |

* cited by examiner

DISPLAY DEVICE, ARRAY SUBSTRATE, AND MANUFACTURING METHOD

BACKGROUND OF THE INVENTION

1. Field of the Invention

The present disclosure generally relates to display techniques, and particularly relates to a display device, an array substrate of the display device, and a manufacturing method of the array substrate.

2. The Related Arts

In liquid crystal display (LCD) industry, existing array substrates usually adopt the single gate structure. For single gate structure, the carrier transportation characteristic would vary after an extended period of operation, which is manifested in the threshold voltage's positive or negative shift (Stress characteristic), leading to the instability of the array substrate's operation.

SUMMARY OF THE INVENTION

The technical issue addressed by the present disclosure is to provide a display device, an array substrate, and a manufacturing method for the array substrate that effectively prevent the variation of threshold voltage.

The array substrate taught by the present disclosure includes a substrate base, and two gates, a source, a drain, an active layer, and a pixel electrode on the substrate base. The drain and the pixel electrode are connected together. The source and the drain contact the active layer, respectively. The two gates control the conduction and cut off of the active layer, which in turn controls the conduction and cut off between the source and the drain.

The source, the two gates, the active layer, the drain, and the pixel electrode are sequentially stacked on the substrate base. The drain and the pixel electrode are at a same level.

The array substrate further includes a buffer layer on the substrate base. A buffer via is configured in the buffer layer, exposing the substrate base. The source is disposed in the buffer via. The source has a top surface level with that of the buffer layer.

The array substrate further includes a passivation layer on the buffer layer and the source. A passivation via is configured in the passivation layer, exposing the source. The two gates are disposed on the passivation layer oppositely across the passivation via. A gate metal, formed when the gates are formed, is disposed in the passivation via, contacting the source. The gate metal has a top surface level with that of the passivation layer.

The array substrate further includes a gate insulating layer on the two gates. A gate insulating via is configured in the gate insulating layer, exposing the gate metal in the passivation via. The active layer is disposed in the gate insulating via. The drain and the pixel electrode are disposed on the active layer.

The active layer is made of one of amorphous silicon, Indium Gallium Zinc Oxide (IGZO), and polycrystalline silicon. If the active layer is made of amorphous silicon, physical vapor deposition is used to form the active layer made of n+ amorphous silicon.

The drain and the pixel electrode are of a same layer. The drain and the pixel electrode are made of one of Indium Tin Oxide (ITO), and MoTi.

The display device taught by the present disclosure includes an array substrate. The array substrate includes a substrate base, and two gates, a source, a drain, an active layer, and a pixel electrode on the substrate base. The drain and the pixel electrode are connected together. The source and the drain contact the active layer, respectively. The two gates control the conduction and cut off of the active layer, which in turn controls the conduction and cut off between the source and the drain.

The source, the two gates, the active layer, the drain, and the pixel electrode are sequentially stacked on the substrate base. The drain and the pixel electrode are at a same level.

The array substrate further includes a buffer layer on the substrate base. A buffer via is configured in the buffer layer, exposing the substrate base. The source is disposed in the buffer via. The source has a top surface level with that of the buffer layer.

The array substrate further includes a passivation layer on the buffer layer and the source. A passivation via is configured in the passivation layer, exposing the source. The two gates are disposed on the passivation layer oppositely across the passivation via. A gate metal, formed when the gates are formed, is disposed in the passivation via, contacting the source. The gate metal has a top surface level with that of the passivation layer.

The array substrate further includes a gate insulating layer on the two gates. A gate insulating via is configured in the gate insulating layer, exposing the gate metal in the passivation via. The active layer is disposed in the gate insulating via. The drain and the pixel electrode are disposed on the active layer.

The active layer is made of one of amorphous silicon, Indium Gallium Zinc Oxide (IGZO), and polycrystalline silicon. If the active layer is made of amorphous silicon, physical vapor deposition is used to form the active layer made of n+ amorphous silicon.

The drain and the pixel electrode are of a same layer. The drain and the pixel electrode are made of one of Indium Tin Oxide (ITO), and MoTi.

The array substrate manufacturing method taught by the present invention includes the steps of providing a substrate base, and sequentially stacking a source, two gates, an active layer, a drain, and a pixel electrode on the substrate base. The drain and the pixel electrode are at a same level.

The method further includes the steps of forming a buffer layer on substrate base through chemical vapor deposition, forming a buffer via in the buffer layer through masking, dry etching, and photoresist removal, and forming the source in the buffer via through physical vapor deposition, masking, wet etching, and photoresist removal. The buffer via exposes the substrate base. The source has a top surface level with that of the buffer layer.

The method further includes the steps of forming a passivation layer on the buffer layer and the source through chemical vapor deposition, forming a passivation via in the passivation layer through masking, dry etching, and photoresist removal, forming a gate metal layer on the passivation layer through physical vapor deposition, and forming the two gates oppositely across the passivation via and a gate metal in the passivation via. The passivation via exposes the source. The gate metal contacts the source and has a top surface level with that of the passivation layer.

The method further includes the steps of forming a gate insulating layer on the gates through physical vapor deposition, forming a gate insulating via in the gate insulating layer through masking, dry etching, and photoresist removal, forming the active layer in the gate insulating via through chemical vapor deposition, masking, dry etching, and photoresist removal, forming a drain metal layer on the active layer and the gate insulating layer through physical vapor deposition, and forming the drain and the pixel electrode on the active layer through masking, wet etching, and photoresist removal. The gate insulating via exposes the gate metal in the passivation via The advantages of the present disclosure are as follows. Compared to the prior art, the array substrate includes a substrate base, and two gates, a source, a drain, an active layer, and a pixel electrode on the substrate base. The drain and the pixel electrode are connected together. The source and the drain contact the active layer, respectively. The two gates control the conduction and cut off of the active layer, which in turn controls the conduction and cut off between the source and the drain. Therefore, the two-gate structure of the present disclosure is capable of preventing the variation of the threshold voltage.

BRIEF DESCRIPTION OF THE DRAWINGS

To make the technical solution of the embodiments according to the present disclosure, a brief description of the drawings that are necessary for the illustration of the embodiments will be given as follows. Apparently, the drawings described below show only example embodiments of the present disclosure and for those having ordinary skills in the art, other drawings may be easily obtained from these drawings without paying any creative effort. In the drawings.

DETAILED DESCRIPTION OF THE PREFERRED EMBODIMENTS

Figure 1:
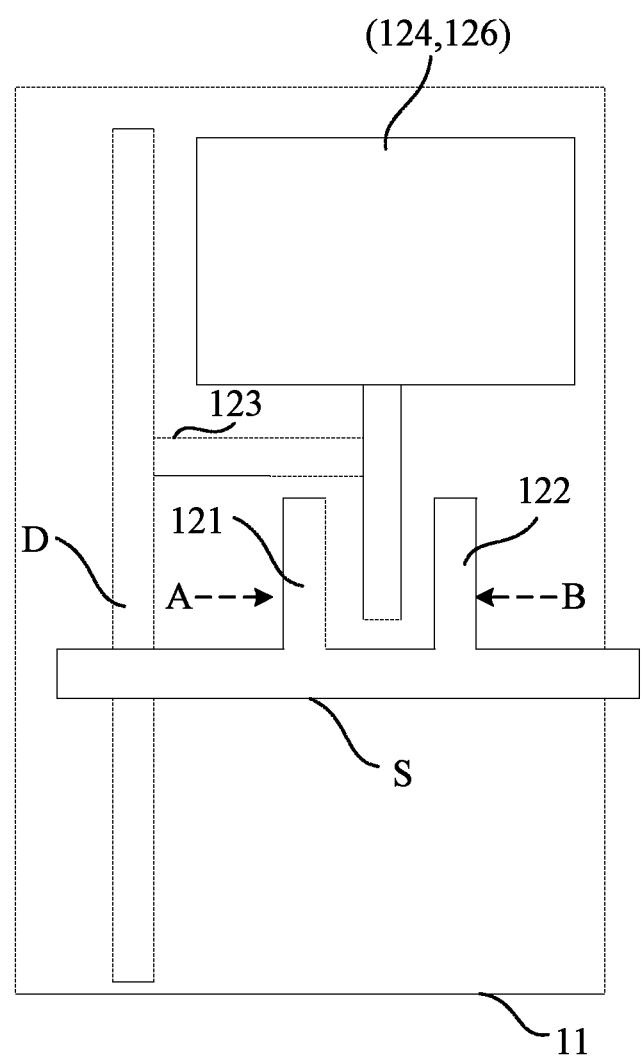
FIG. 1 is schematic diagram showing an array substrate according to an embodiment of the present disclosure.
Figure 2:
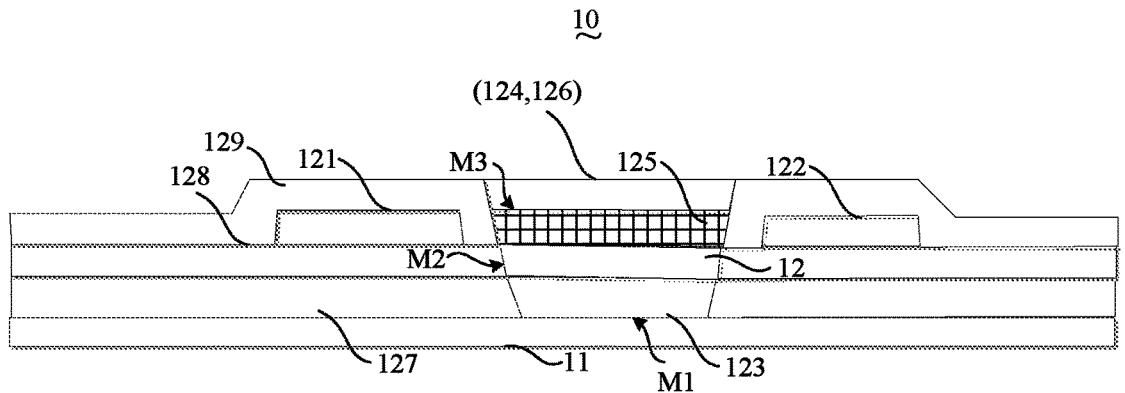
FIG. 2 is a sectional diagram showing the array substrate along the A-B line of FIG. 1.

FIG. 1 is schematic diagram showing an array substrate according to an embodiment of the present disclosure. FIG. 2 is a sectional diagram of the array substrate along the A-B line of FIG. 1. As illustrated, the array substrate 10 includes a substrate base 11 and, on the substrate base 11, two gates 121 and 122, a source 123, a drain 124, an active layer 125, and a pixel electrode 126. The drain 124 is connected to the pixel electrode 26. The source 123 and the drain 124 are connected to the active layer 125, respectively. The gates 121 and 122 are for controlling the conduction and cut off of the active layer 125, which in turn controls the conduction and cut off between the source 123 and the drain 124. The source 123, the gates 121, 122, the active layer 125, and the drain 124 are sequentially stacked on the substrate base 11. The drain 124 and the pixel electrode 126 are disposed at a same level.

In the present embodiment, two gates 121 and 122 are disposed between the source 123 and the drain 124, thereby effectively preventing variation of the threshold voltage.

The array substrate 10 of the present embodiment further includes a buffer layer 127 disposed on the substrate base 11. A buffer via M1 is formed in the buffer layer 127 exposing the substrate base 11. The source 123 is disposed in the buffer via M1 and whose top surface is level with that of the buffer layer 127. It should be understood that the data line D of the array substrate 10 is at a same level as the source 123. The two are formed together in the manufacturing process. Therefore, the buffer via M1 is preferably formed at where the data line D is located and the data line D has its top surface level with that of the buffer layer 127.

In the present embodiment, the buffer via M1 is formed on the buffer layer 127. The source 123 and the data line D are disposed in the buffer via M1, and all have their top surfaces level with that of the buffer layer 127. As such, on one hand, no climbing is required when forming subsequent electrical connection with other layers, and the electrical connection is not affected by climbing. In addition, since the buffer via M1, the data line D, and the source 123 are leveled, a masking step may be omitted in the manufacturing process. Furthermore, since the metallic source 123 and the data line D are all embedded in the buffer layer 127, their oxidization is prevented.

Moreover, the array substrate 10 further include a passivation layer 128 disposed on the buffer layer 127 and the source 123. A passivation via M2 is formed in the passivation layer 128, exposing the source 123. The two gates 121 and 122 are disposed on the passivation layer 128 oppositely across the via M2. A gate metal 12 is formed in the passivation via M2 at a same time when the gates 121 and 122 are formed. The gate metal 12 contacts the source 123 and has its top surface level with that of the passivation layer 128. In other words, the gate metal 12 in the passivation via M2 is stacked on the source 123 and becomes a part of the source 13. The depth of the source 123 is as such increased, and the electrical field strength of the source 123 is increased as well. Additionally, as the gate metal 12 in the passivation via M2 and the passivation layer 128 are leveled, this facilitates the gates 121 and 122's control to the source 123.

In the present embodiment, the two gates 121 and 122 are disposed symmetrically across the active layer 125. As will be described below, the active layer 125 is disposed in the passivation via M2, further enhancing the array substrate 10's Stress characteristic.

It should be understood that the array substrate 10's scan line S and gates 121 and 122 are at a same level, and they are formed together in the manufacturing process.

Additionally, the array substrate 10 further includes a gate insulating layer 129 disposed on the gates 121 and 122. A gate insulating via M3 is formed in the gate insulating layer 129, exposing the gate metal 12 in the passivation via M2. The active layer 125 is disposed in the gate insulating via M3, and the drain 124 and the pixel electrode 126 are disposed on the active layer 125.

In the present embodiment, the active layer 125 may be made of amorphous silicon, Indium Gallium Zinc Oxide (IGZO), or polycrystalline silicon. If amorphous silicon is used, n+ amorphous silicon (i.e., doped amorphous silicon) may be directly formed through physical vapor deposition without a dry etching process to cut off n+ amorphous silicon.

In the present embodiment, the drain 124 and the pixel electrode 126 are preferably a same layer. That is, the pixel electrode 126 also functions as the drain 124. The pixel electrode 126 may be an Indium Tin Oxide (ITO), or MoTi electrode.

Figure 3:
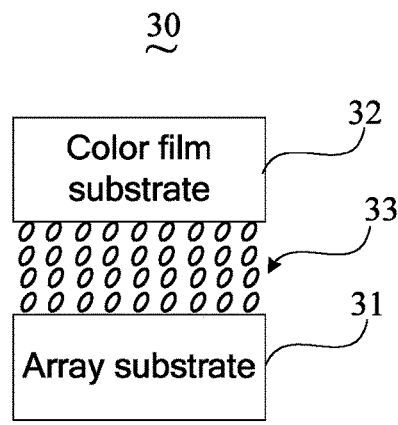
FIG. 3 is schematic diagram showing a display device according to an embodiment of the present disclosure.

The present disclosure also teaches a display device 30 as shown in FIG. 3. The display device 30 includes an array substrate 31, an oppositely disposed color film substrate 32, and a liquid crystal layer 33 sandwiched between the array substrate 31 and the color film substrate 32. The array substrate 31 is the above described array substrate 10 and its details are omitted here.

Figure 4:
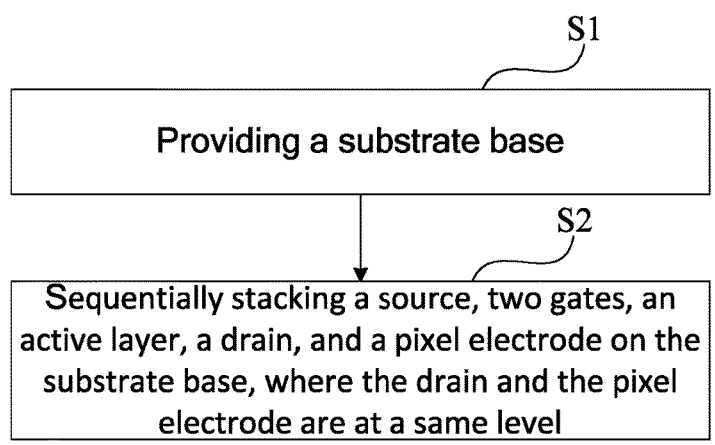
FIG. 4 is a flow diagram showing the steps of a manufacturing method of the array substrate of FIG. 1 according to an embodiment of the present disclosure.
Figure 5:
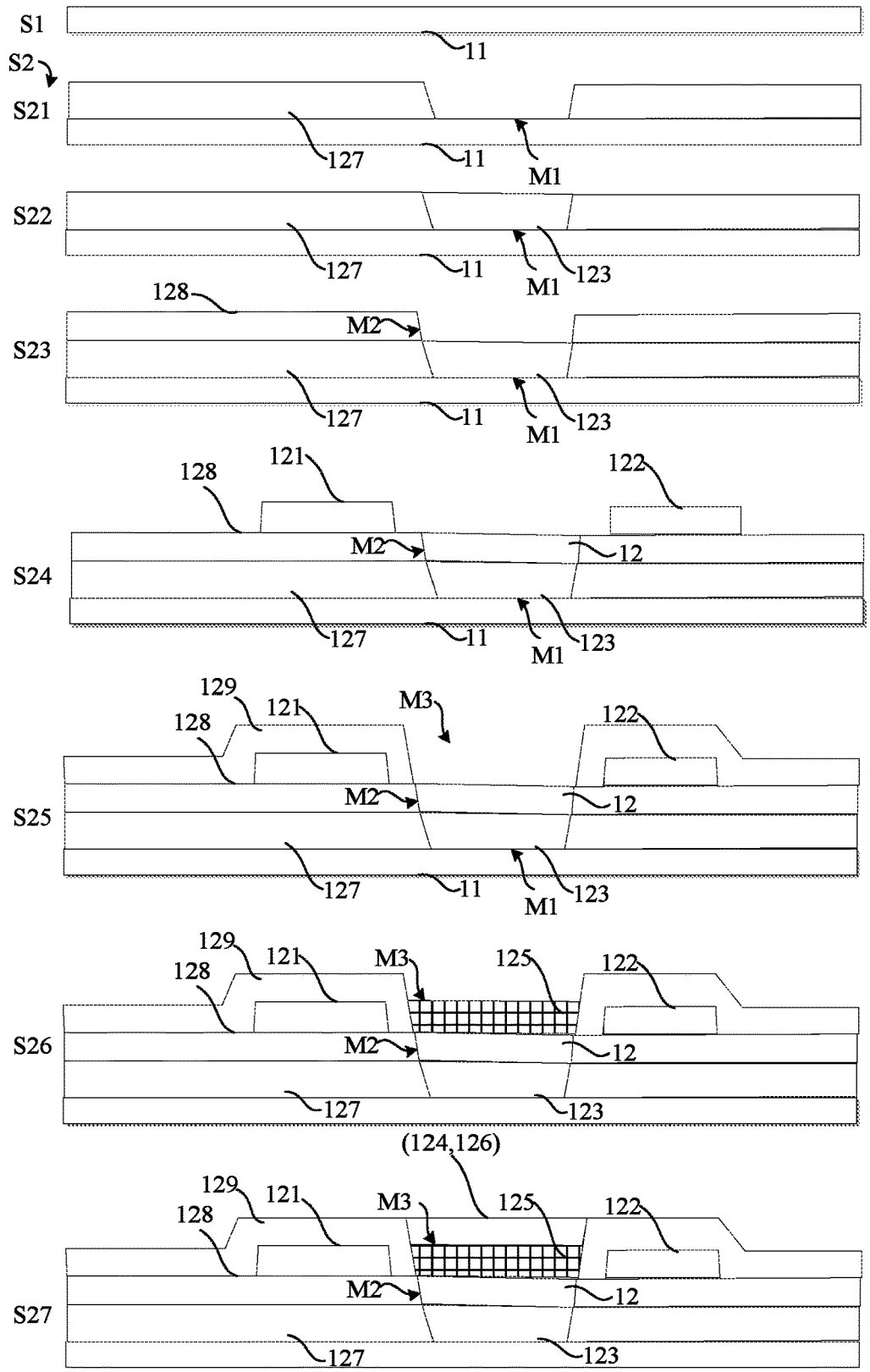
FIG. 5 provides schematic sectional views to the evolvement of the array substrate of FIG. 1 in accordance with the steps of FIG. 4.
Figure 6:
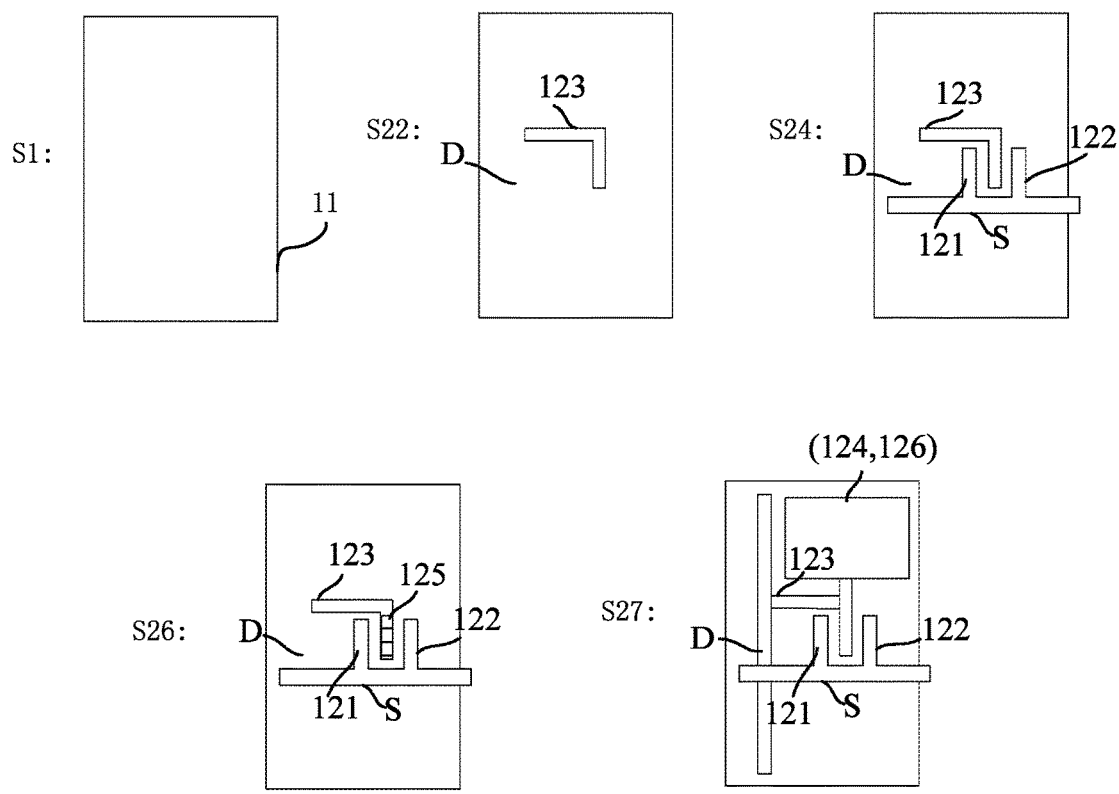
FIG. 6 provides schematic top views to the evolution of the array substrate of FIG. 1 in accordance with the steps of FIG. 4.

The present disclosure also teaches a manufacturing method for the above described array substrates 10 and 31. As illustrated n FIGS. 4 to 6, the manufacturing method includes the following steps.

In step S1, the substrate base 11 is provided.

In step S2, the source 123, the gates 121 and 122, the active layer 125, the drain 124, and the pixel electrode 126 are sequentially stacked on the substrate base 11. The drain 124 and the pixel electrode 126 are disposed at the same level.

The step S2 may further includes the following steps.

In step S21, the buffer layer 127 is formed on substrate base 11 through chemical vapor deposition, and the buffer via M1 exposing the substrate base 11 is formed in the buffer layer 127 through masking, dry etching, and photoresist removal.

In step S22, the source 123 is formed in the buffer via M1 whose top surface is level with that of the buffer layer 127 through physical vapor deposition, masking, wet etching, the photoresist removal.

In this step, the data line D that is at the same level with the source 123 are formed together. Specifically, the data line D is also formed in the buffer via M1 and has its top surface level with that of the buffer layer 127.

In this step, the buffer via M1 is formed in the buffer layer 127. The source 123 and the data line D are formed in the buffer via M1, and all have their top surfaces level with that of the buffer layer 127. As such, on one hand, no climbing is required when forming subsequent electrical connection with other layers, and the electrical connection is not affected by climbing. In addition, since the buffer via M1, the data line D, and the source 123 are leveled, a masking step may be omitted in the manufacturing process. Furthermore, since the metallic source 123 and the data line D are all embedded in the buffer layer 127, their oxidization is prevented.

In step S23, the passivation layer 128 is formed on the buffer layer 127 and the source 123 through chemical vapor deposition, and the passivation via M2 is formed in the passivation layer 128 through masking, dry etching, and photoresist removal. The passivation via M2 exposes the source 123.

In step S24, a gate metal layer is formed on the passivation layer 128 through physical vapor deposition. Then, through masking, wet etching, and photoresist removal, the gates 121 and 122 are formed oppositely across the passivation via M2 and the gate metal 12 is left in the passivation via M2. The gate metal 12 contacts the source 123 and has its top surface level with that of the passivation layer 128. In other words, the gate metal 12 in the passivation via M2 is stacked on the source 123 and becomes a part of the source 13. The depth of the source 123 is as such increased, and the electrical field strength of the source 123 is increased as well. Additionally, as the gate metal 12 in the passivation via M2 and the passivation layer 128 are leveled, this facilitates the gates 121 and 122's control to the source 123.

In this step, the scan line S is also formed at the same time and at the same level as the gates 121 and 122.

In step S25, the gate insulating layer 129 is formed on the gates 121 and 122 through physical vapor deposition, and the gate insulating via M3 exposing the gate metal 12 in the passivation via M2 is formed in the gate insulating layer 129 through masking, dry etching, and photoresist removal.

In step S26, the active layer 125 is formed in the gate insulating via M3 through chemical vapor deposition, masking, dry etching, and photoresist removal. The active layer 125 may be made of amorphous silicon, Indium Gallium Zinc Oxide (IGZO), or polycrystalline silicon. If amorphous silicon is used, n+ amorphous silicon (i.e., doped amorphous silicon) may be directly formed through physical vapor deposition without a dry etching process to cut off n+ amorphous silicon.

In step S27, a drain metal layer is formed on the active layer 125 and the gate insulating layer 129 through physical vapor deposition. Then, through masking, wet etching, and photoresist removal, the drain 124 and the pixel electrode 126 is formed on the active layer 125. In other words, the pixel electrode 126 also functions as the drain 124. The pixel electrode 126 may be an Indium Tin Oxide (ITO), or MoTi electrode.

As described above, the present disclosure is capable of effectively preventing the variation of threshold voltage.

Embodiments of the present disclosure have been described, but not intending to impose any unduly constraint to the appended claims. Any modification of equivalent structure or equivalent process made according to the disclosure and drawings of the present disclosure, or any application thereof, directly or indirectly, to other related fields of technique, is considered encompassed in the scope of protection defined by the clams of the present disclosure.

What is claimed is:

1. An array substrate, comprising a substrate base, and two gates, a source, a drain, an active layer, and a pixel electrode on the substrate base, wherein the drain and the pixel electrode are connected together; the source and the drain contact the active layer, respectively; and the two gates control the conduction and cut off of the active layer, which in turn controls the conduction and cut off between the source and the drain;

wherein the source, the two gates, the active layer, the drain, and the pixel electrode are sequentially stacked on the substrate base; and the drain and the pixel electrode are at a same level;

wherein the array substrate further comprises a buffer layer on the substrate base, wherein a buffer via is configured in the buffer layer, exposing the substrate base; the source is disposed in the buffer via; and the source has a top surface level with that of the buffer layer;

wherein the array substrate further comprises a passivation layer on the buffer layer and the source, wherein a passivation via is configured in the passivation layer, exposing the source; the two gates are disposed on the passivation layer oppositely across the passivation via; a gate metal, formed when the gates are formed, is disposed in the passivation via, contacting the source; and the gate metal has a top surface level with that of the passivation layer.

2. The array substrate as claimed in claim 1, further comprising a gate insulating layer on the two gates; a gate insulating via is configured in the gate insulating layer, exposing the gate metal in the passivation via; the active layer is disposed in the gate insulating via; and the drain and the pixel electrode are disposed on the active layer.

3. The array substrate as claimed in claim 1, wherein the active layer is made of one of amorphous silicon, Indium Gallium Zinc Oxide (IGZO), and polycrystalline silicon; and, if the active layer is made of amorphous silicon, physical vapor deposition is used to form the active layer made of n+ amorphous silicon.

4. The array substrate as claimed in claim 1, wherein the drain and the pixel electrode are of a same layer; and the drain and the pixel electrode are made of one of Indium Tin Oxide (ITO) and MoTi.

5. An display device, comprising an array substrate, wherein the array substrate comprises a substrate base, and two gates, a source, a drain, an active layer, and a pixel electrode on the substrate base; the drain and the pixel electrode are connected together; the source and the drain contact the active layer, respectively; and the two gates control the conduction and cut off of the active layer, which in turn controls the conduction and cut off between the source and the drain;

wherein the source, the two gates, the active layer, the drain, and the pixel electrode are sequentially stacked on the substrate base; and the drain and the pixel electrode are at a same level;

wherein the array substrate further comprises a buffer layer on the substrate base, wherein a buffer via is configured in the buffer layer, exposing the substrate base; the source is disposed in the buffer via; and the source has a top surface level with that of the buffer layer wherein the array substrate further comprises a passivation layer on the buffer layer and the source, wherein a passivation via is configured in the passivation layer, exposing the source; the two gates are disposed on the passivation layer oppositely across the passivation via; a gate metal, formed when the gates are formed, is disposed in the passivation via, contacting the source; and the gate metal has a top surface level with that of the passivation layer.

6. The display device as claimed in claim 5, further comprising a gate insulating layer on the two gates; a gate insulating via is configured in the gate insulating layer, exposing the gate metal in the passivation via; the active layer is disposed in the gate insulating via; and the drain and the pixel electrode are disposed on the active layer.

7. The display device as claimed in claim 5, wherein the active layer is made of one of amorphous silicon, Indium Gallium Zinc Oxide (IGZO), and polycrystalline silicon; and, if the active layer is made of amorphous silicon, physical vapor deposition is used to form the active layer made of n+ amorphous silicon.

8. The display device as claimed in claim 5, wherein the drain and the pixel electrode are of a same layer; and the drain and the pixel electrode are made of one of Indium Tin Oxide (ITO), and MoTi.

\* \* \* \* \*